(12) United States Patent
Yokogawa et al.

(10) Patent No.: US 6,713,401 B2
(45) Date of Patent: Mar. 30, 2004

(54) METHOD FOR MANUFACTURING SEMICONDUCTOR DEVICE

(75) Inventors: Kenetsu Yokogawa, Tsurugashima (JP); Yoshinori Momonoi, Kokubunji (JP); Kazunori Tsujimoto, Higashiyamato (JP); Shinichi Tachi, Sayama (JP)

(73) Assignee: Hitachi, Ltd., Tokyo (JP)

( * ) Notice: Subject to any disclaimer, the term of this patent is extended or adjusted under 35 U.S.C. 154(b) by 43 days.

(21) Appl. No.: 09/939,770

(22) Filed: Aug. 28, 2001

(65) Prior Publication Data

US 2002/0094691 A1 Jul. 18, 2002

(30) Foreign Application Priority Data

Jan. 16, 2001 (JP) ........................... 2001-007158

(51) Int. Cl.[7] .............................................. H01L 21/00
(52) U.S. Cl. .................. 438/710; 156/345.33; 438/732
(58) Field of Search ..................... 438/710, 725, 438/732; 156/345.25, 345.28, 345.33, 345.34, 345.38

(56) References Cited

U.S. PATENT DOCUMENTS

| 5,403,434 A | * | 4/1995 | Moslehi .............. 156/345.38 X |
| 5,914,278 A | * | 6/1999 | Boitnott et al. ..... 156/345.33 X |
| 6,042,687 A | * | 3/2000 | Singh et al. ........... 156/345.33 |

FOREIGN PATENT DOCUMENTS

| JP | 08-85887 | 9/1994 |
| JP | 08-131981 | 11/1994 |
| JP | 09-17776 | 6/1995 |

* cited by examiner

Primary Examiner—William A. Powell
(74) Attorney, Agent, or Firm—Reed Smith LLP; Stanley P. Fisher, Esq.; Juan Carlos A. Marquez, Esq.

(57) ABSTRACT

Disclosed is a method for manufacturing a semiconductor device which efficiently carries out a process on a semiconductor substrate, such as dry etching, and cleaning for removing a foreign matter after the process. The method includes a step of removing a foreign matter by using both an electric action of a plasma generated by plasma generation means and a physical action caused by a frictional stress of a fast gas stream formed by a pad structure which is arranged close to a wafer surface.

14 Claims, 11 Drawing Sheets

FABRICATION
OF DEVICE ISOLATION
REGION AND DEPOSITION
OF POLYSILICON

FABRICATION
OF GATE ELECTRODE
(POLYSILICON ETCHING)

← CLEANING

FABRICATION
OF EXTENSION

← CLEANING

DEPOSITION
OF NITRIDE FILM

← CLEANING

FABRICATION
OF GATE SIDE
WALL FILM

← CLEANING

FABRICATION
OF SILISIDE

← CLEANING

METHOD FOR MANUFACTURING SEMICONDUCTOR DEVICE

BACKGROUND OF THE INVENTION

1. Field of the Invention

The present invention relates to a technique of manufacturing semiconductor devices including a cleaning step, and, more particularly, to a technique of manufacturing semiconductor devices including a cleaning step for removing a foreign matter or the like which remains on the surface of a semiconductor wafer.

2. Description of the Prior Art

The technique of fabricating semiconductor devices (such as LSI and VLSI) has rapidly been advanced for device miniaturization. Cleaning of a semiconductor wafer in the manufacturing steps for a semiconductor device is one of important processes to improve the production yield of semiconductor devices. In this respect, cleaning is performed as a preprocess or a postprocess of each manufacturing step, such as deposition or etching.

Conventionally, cleaning of a semiconductor wafer (hereinafter called "wafer") is carried out by washing a foreign matter off the wafer surface by dipping the wafer in pure water or a solution having various kinds of acids or an alkaline solution diluted in pure water or spraying the pure water or the solution to the wafer. Also available is a scheme of dipping a wafer in such a solution and, at the same time mechanically cleaning the wafer surface by a brush. Those cleaning schemes are called wet cleaning as they use a solution.

However, wet cleaning requires steps following the cleaning step, such as rinsing and drying, thus increasing the number of manufacturing steps.

Dry cleaning is a solution to the problem of wet cleaning.

One type of dry cleaning is disclosed in, for example, Japanese Patent Laid-Open No. 131981/1996 (hereinafter referred to as "prior art document 1"). The prior art document 1 describes that an object to be cleaned (specimen) is a 6-inch silicon wafer which is, for example, single-crystalline silicon sliced, lapped and polished, and a matter stuck on the specimen to be cleaned due to static-electricity originated charging is cleaned by a nominal temperature dry method using activated air. That is, in the cleaning step, the active air includes air ions and water cluster, forms a high-humidity atmosphere and contacts the specimen to be cleaned in a cleaning chamber while flowing. The air ions neutralize charges of the specimen to be cleaned, and the water cluster frees the stuck matter from the surface of the specimen to be cleaned. The flowing active air separates and removes the stuck matter from the specimen to be cleaned. The prior art document 1 specifically discloses preprocess cleaning at the time of manufacturing an LSI after Si wafers are purchased from a wafer maker.

Another dry cleaning is disclosed in Japanese Patent Laid-Open No. 85887/1996 (hereinafter referred to as "prior art document 2"). The prior art document 2 describes that after a specimen which has a single-layer film or a multi-layer film containing W as a to-be-etching material is subjected to an etching process, the specimen is transferred to a postprocessing apparatus (a processing apparatus in a next step) by a vacuum transfer apparatus. Then, a photoresist and a stuck matter are simultaneously removed (plasma ashing) in that processing apparatus (in vacuum) without exposing the specimen to the air.

Different dry cleaning is disclosed in Japanese Patent Laid-Open No. 17776/1997 (hereinafter referred to as "prior art document 3"). According to the prior art document 3, in forming a film whose deposition thickness is apt to be affected by an adsorbed organic matter on a semiconductor substrate, $O_3$ cleaning is performed, before the deposition of a base film, at room temperature or a high temperature in the same semiconductor device manufacturing apparatus to remove the adsorbed organic matter, thereby stabilizing deposition which is likely to be affected by the surface state of the semiconductor substrate. That is, according to the subject matter described in the prior art document 3, by directly using the semiconductor device manufacturing apparatus that has formed an underlying interconnection pattern on a semiconductor substrate, an $O_3$ gas is fed to clean the semiconductor substrate and is reacted with a residual organic matter on the surface of the semiconductor substrate to remove the residual organic matter as a volatile matter, such as CO or $CO_2$, and a film which is unstable to an organic matter is deposited as an interlayer insulating film, after removal of the residual organic matter, via a base film without being affected by the residual organic matter.

SUMMARY OF THE INVENTION

Recently, the mainstream has changed from small-commodity mass-production typified by production of DRAMs to large-commodity mass-production symbolized for on chips (so-called system LSIs). In the case of large-commodity mass-production, attention has been paid to shorten the TAT (Turn Around Time) in order to improve the production efficiency.

Therefore, dry cleaning is demanded as cleaning which is performed as a preprocess or postprocess in the process of manufacturing a semiconductor device in order to improve the efficiency of manufacturing a semiconductor device.

Further, an improvement on the performance of dry cleaning is demanded to improve the production yield of semiconductor devices.

Accordingly, it is an object of the invention to efficiently process a substrate and perform cleaning to remove a foreign matter after the process.

It is another object of the invention to provide a novel method for manufacturing a semiconductor device suitable for miniaturization.

The above and other objects of the invention and the features thereof that are believed to be novel will be readily apparent from the following detailed description, taken in conjunction with the accompanying drawings.

DESCRIPTION OF THE PREFERRED EMBODIMENTS

The following briefly discusses a typified one of the subject matters disclosed in this application.

One feature of the invention lies in that a foreign matter stuck on the major surface of a semiconductor substrate is removed by supplying a gas stream to the major surface in a process chamber which is kept depressurized.

Another feature of the invention lies in that the bonding strength of a foreign matter stuck on the major surface of a semiconductor substrate is relaxed in a process chamber which is kept depressurized, and a gas stream is supplied to the major surface to remove the foreign matter.

The following discusses embodiments of the invention in detail with reference to the accompanying drawings. To avoid the redundant description, like or same reference symbols are given, in the entire diagrams for explaining the embodiments, to those corresponding members of the embodiments which have the same functions.

First Embodiment

Figure 1:
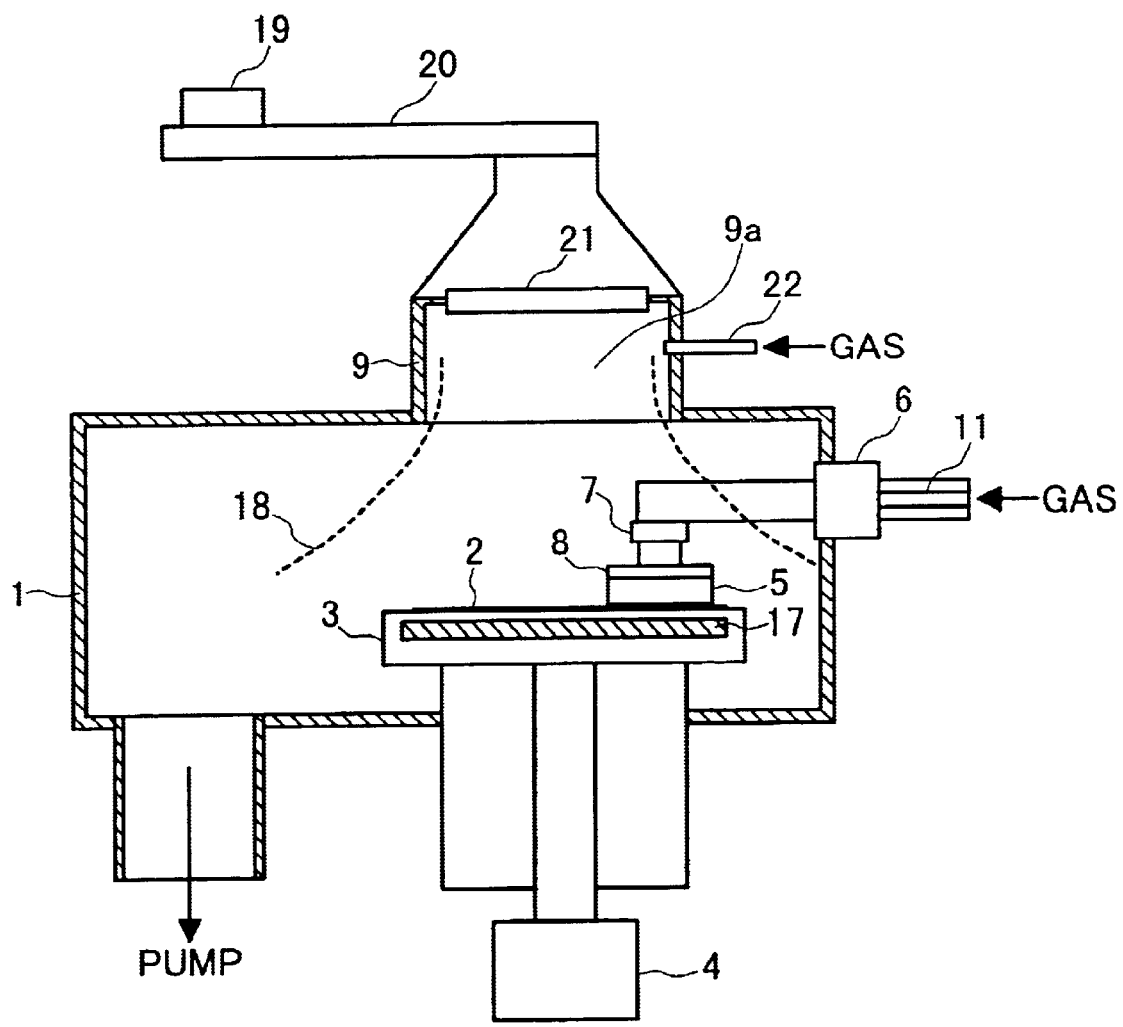
FIG. 1 is a basic structural diagram of a first embodiment of the invention.

To begin with, the basic structure of a dry cleaning apparatus that is used in the first embodiment of the invention is described referring to FIG. 1.

The dry cleaning apparatus shown in FIG. 1 has a process chamber 1 which keeps a depressurized state or which is a generally called vacuum chamber. A wafer 2 which has undergone a desired process (such as plasma etching or plasma CVD) in another process chamber is cleaned in the process chamber or vacuum chamber 1.

In FIG. 1, arranged inside the vacuum chamber 1 having vacuum pump means (vacuum pump; not shown) are wafer mounting means (wafer table) 3 on which the wafer 2 to be treated is mounted and a rotary mechanism 4 which rotates the wafer 2 in the circumferential direction.

The flat side of the wafer table 3 has a disc shape similar to the shape of the wafer 2 and is larger in diameter than the wafer 2 to stably support the wafer 2. The wafer 2 is secured on the wafer table 3 by a mechanism for mechanically holding the periphery of the wafer 2 or an electrostatic chuck which electrically holds the wafer 2. The wafer table 3 is provided with temperature control means 16 capable of controlling the temperature of the wafer 2 in a range of room temperature (25° C.) to 300° C. The temperature control on the wafer 2 will be discussed later. A pad structure 5 for wafer cleaning is arranged over the wafer 2 and close to the surface of the wafer 2. The pad structure 5 plays an important role in achieving the invention. The pad structure 5 is provided with a scanning mechanism 6 which can move the pad structure 5 horizontally over the wafer 2 and wafer elevation means 7 which positions the pad structure 5 close to the wafer 2. The pad structure 5 is further provided with weight detecting means 8 which detects a weight acting between the pad structure 5 and the wafer 2. The distance between the pad structure 5 and the wafer 2 is controlled by controlling the amount of movement of the wafer elevation means 7 based on the weight acting between the pad structure 5 and the wafer 2. Controlling this distance controls the flow rate of the cleaning gas as will be discussed later.

Plasma generation means 9 is provided at the upper portion of the vacuum chamber 1. In the embodiment, the plasma generation means 9 uses an electromagnetic wave of the microwave band (specifically, 2.45 GHz). The plasma generation means 9 comprises a microwave generator 19, a waveguide tube 20 and a dielectric window 21. A $CF_4$ gas is supplied to a plasma generator 9a from the gas inlet section or gas inlet section 21. Although the plasma generation means 9 uses an electromagnetic wave of the microwave band in the embodiment, a similar effect is obtainable if a plasma is generated by an UHF-band electromagnetic wave or radio-band electromagnetic wave, or by applying a magnetic field to any of the electromagnetic waves. The wafer 2 is placed in a diffusion area of a plasma 18 that is generated by the plasma generation means 9. Placing the wafer 2 in the diffusion area can prevent excess damages or the like from being made on the wafer 2.

The pad structure 5 is specifically described below with reference to FIGS. 2 and 3.

Figure 2:
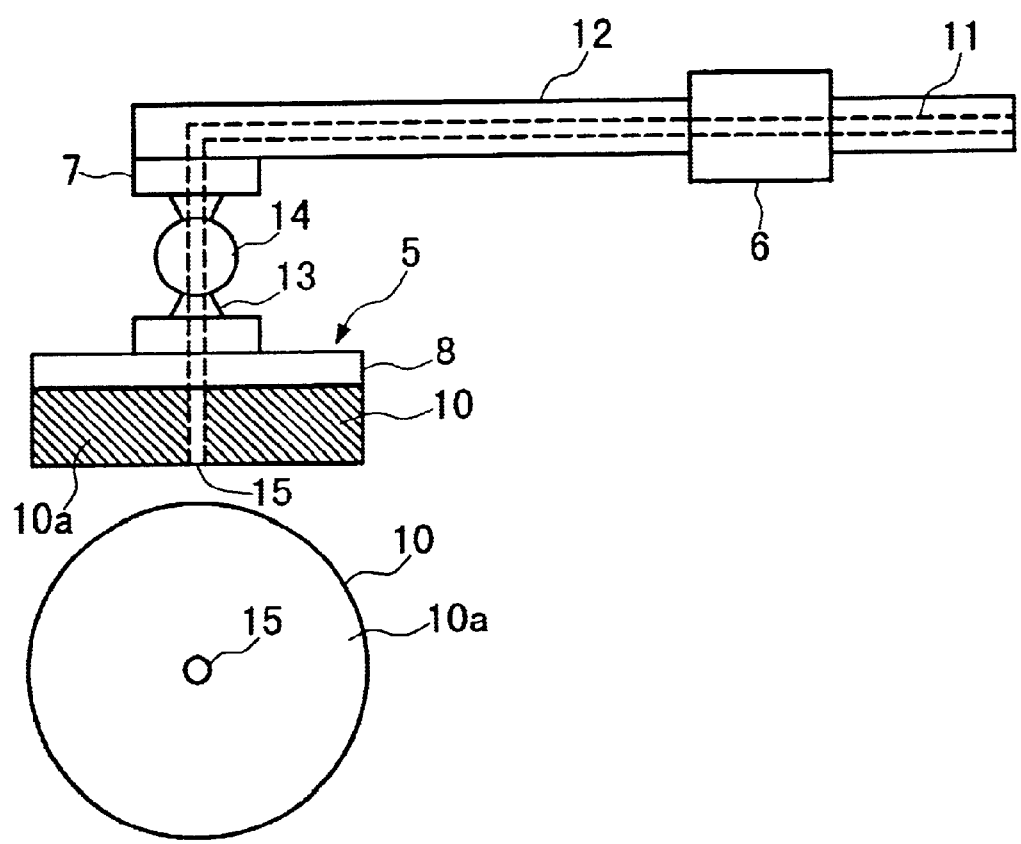
FIG. 2 is a detailed explanatory diagram of a first pad structure used in the first embodiment of the invention.

FIG. 2 shows the partial cross section of the pad structure 5 and a plan view of a pad 10. The pad structure 5 comprises the pad 10 formed of teflon, a gas inlet section 11, a pad support 12 and a connection mechanism 13 to the weight detecting means 8, the scanning mechanism 6 and the wafer elevation means 7. The pad 10 has a circular opposing major surface 10a to the wafer surface. The connection mechanism 13 is designed to have a joint function which can control the parallelism between the major surface of the wafer 2 and the major surface of the pad 10 about a fulcrum 14. The gas inlet section 11 is connected to the pad support 12 which has a hollow internal structure. A foreign-matter removing gas which is supplied to the gas inlet section 11 is ejected via the pad support 12 from a gas ejection section 15 provided in the major surface 10a of the pad 10. According to the embodiment, the gas is ejected from the single gas ejection section 15 provided in the center portion of the pad 10.

Figure 3:
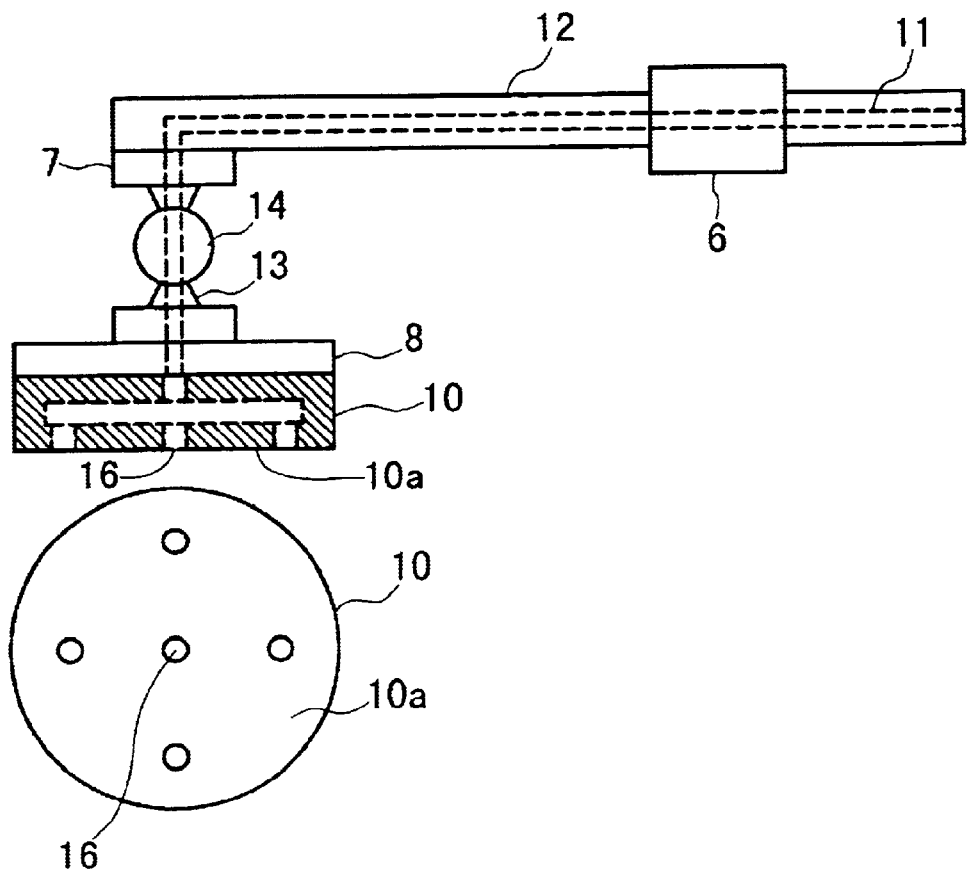
FIG. 3 is a detailed explanatory diagram of a second pad structure used in the first embodiment of the invention.

FIG. 3 shows the partial cross section of a modified pad structure 5 designed to enhance the foreign-matter removing performance and a plan view of a modified pad 10. As shown in FIG. 3, the pad structure 5 is provided with a plurality of gas ejection sections 16 arranged evenly in the plane of the pad 10. Specifically, one gas ejection section 16 is located in the center portion of the pad 10 and two gas ejection sections are provided around the former gas ejection section 16 at the peripheral portion of the pad 10 in a horizontally symmetrical fashion. Further, two gas ejection sections are provided around the center gas ejection section 16 at the peripheral portion of the pad 10 in a vertically symmetrical fashion. Because the flow rate near the gas ejection section is high, the provision of plural gas ejection sections as shown in FIG. 3 can improve the foreign-matter removing performance and the throughput of foreign-matter removal. A foreign matter which remains due to the action of both gases ejected from the two adjoining gas ejection sections provided at the peripheral portion of the pad 10 is pushed out by the gas that is blown out from the gas ejection section 16 located in the center portion of the pad 10, so that foreign matters lying on the wafer surface can be removed.

The pads 10 of the pad structures 5 shown in FIGS. 2 and 3 are formed of teflon, a softer material than the material for the surface of the wafer 2, to avoid damages on the surface of the wafer 2. It is however needless to say that a similar effect can be acquired by using other materials, such as polyvinylalcohol, Derlin, vespel, kapton, polyvinyl chloride, polyester, silicon oxide, silicon and aluminum oxide as well. The pad 10 may contact the surface of the wafer 2 at the time of cleaning. It is therefore desirable to basically use a softer material for the pad than the material for the surface of the wafer 2. That is, materials which are harder than the material for the surface of the wafer 2 are used for those portions of the rotary mechanism 4 and the pad structure 5, respectively provided over the top surface of the wafer 2 and at the back thereof, which are close to the wafer surface to be treated.

In the embodiment, the major surface of the pad structure 5 which faces the wafer 2 has a diameter of 3 cm to permit the active species generated by the plasma generation means 9 to easily reach the wafer 2. If the pad structure 5 is too large, the pad structure 5 covers the wafer surface, preventing a plasma-based active species from reaching the wafer 2. In this respect, the diameter of the pad structure 5 should be smaller than that of the wafer 2.

An example of a cleaning step according to the first embodiment is described below referring to FIG. 1.

First, the wafer 2 to be cleaned is mounted on the wafer table 3. The wafer 2 in use is, for example, a disc-like single-crystalline silicon substrate having a diameter of approximately 300 mm. An insulating film having through holes (openings) acquired by dry etching in a previous step is provided on the major surface wafer 2.

After the wafer 2 is placed on the wafer table 3, the air in the vacuum chamber 1 is pumped out by the vacuum pump means. The pumping speed then is controlled in such a way as not to leave a foreign matter (i.e., particles) in the vacuum chamber 1.

Next, the wafer 2 is rotated in the circumferential direction by the rotary mechanism 4. According to the embodiment, the rotational speed of the wafer 2 was set to 200 rpm. This rotational speed is associated with the throughput of the removal of the foreign matter and is arbitrarily controlled. The temperature of the wafer 2 was set to 100° C. by the temperature control means 16. Increasing the temperature of the wafer 2 can improve the efficiency of a chemical reaction on the wafer surface, thereby enhancing the cleaning efficiency. If the temperature of the wafer 2 is too high, it affects the characteristics of a semiconductor device formed on the wafer 2. It is therefore preferable to heat the wafer 2 to 300° C. or lower.

After the wafer 2 comes to a stable rotational state, an Ar gas (inactive gas) is ejected onto the surface of the wafer 2 at a rate of 20 litters/minute (1/min) from the gas inlet section 11 through the pad structure 5 (FIG. 2). Then, the pad structure 5 is moved toward the wafer 2 by the scanning mechanism 6. At the same time, the plasma generation means 9 generates in the vacuum chamber 1 the plasma 18 of a mixed gas of a $CF_4$ (etching gas) fed from separate second gas inlet means 22 and the Ar gas fed from the gas inlet section 11 through the pad structure 5.

During generation of the plasma, the pad structure 5 is moved close to the wafer 2 by the wafer elevation means 7. At this time, the weight detecting means 8 detects the force acting between the pad structure 5 and the wafer 2 and the distance between the pad surface and the surface of the wafer 2 is controlled based on the detected force. Specifically, the Ar gas supplied from the pad structure 5 renders the space between the pad surface and the surface of the wafer 2 in a high-gas pressure state. Because a weight is produced between the pad 10 and the wafer 2 even if the pad 10 does not contact the wafer 2, the distance between the pad surface and the surface of the wafer 2 can be controlled by adjusting the weight and the flow rate of the gas to be fed. A piezoelectric device, a strain gauge, a spring, an elasticity material and a weight may be used singularly or in combination for the weight detecting means 8.

According to the embodiment, the distance between the pad surface and the surface of the wafer 2 is so controlled as to be 5 to 20 $\mu$m. A similar effect is however obtained if the distance between the pad surface and the surface of the wafer 2 is set in a range of 1 to 100 $\mu$m. In consideration of the cleaning power alone, the narrower the distance between the pad surface and the surface of the wafer 2 is, the higher the cleaning power obtained becomes. In this case, however, it becomes difficult to keep the distance constant and, what is more, the pad surface and the surface of the wafer 2, if positioned too close to each other, are likely to contact each other, thus damaging the surface of the wafer 2. In view of this point, the distance ranging from 1 to 100 $\mu$m is the most effective.

Although Ar is used as the gas to be supplied through the pad structure 5 in the embodiment, nitrogen, He, Xe or Ne may of course be used as well in demonstrating a similar effect. Although the flow rate of the gas to flow between the pad structure 5 and the wafer 2 is set to 20 1/min in the embodiment, a similar effect is demonstrated if the gas flow rate is in a range of 0.5 to 500 1/min. In view of the cleaning power alone, naturally, as the gas flow rate gets higher, the cleaning power becomes greater. In consideration of the gas-consumption based cost performance or the like, however, the practical range of the gas flow rate is 0.5 to 500 1/min.

The embodiment is designed in such a way that by scanning over the wafer 2 with the pad structure 5 having a controlled distance to the wafer 2 by the scanning mechanism 6, the entire surface of the wafer 2 can be scanned with the pad structure 5 in addition to the rotation of the wafer 2.

Although the rotary mechanism 4 is used to rotate the wafer 2 in the embodiment, a similar effect is acquired if a mechanism for rotating the pad structure 5 is used or if the wafer rotating mechanism and the pad-structure rotating mechanism are both used.

Figure 13:
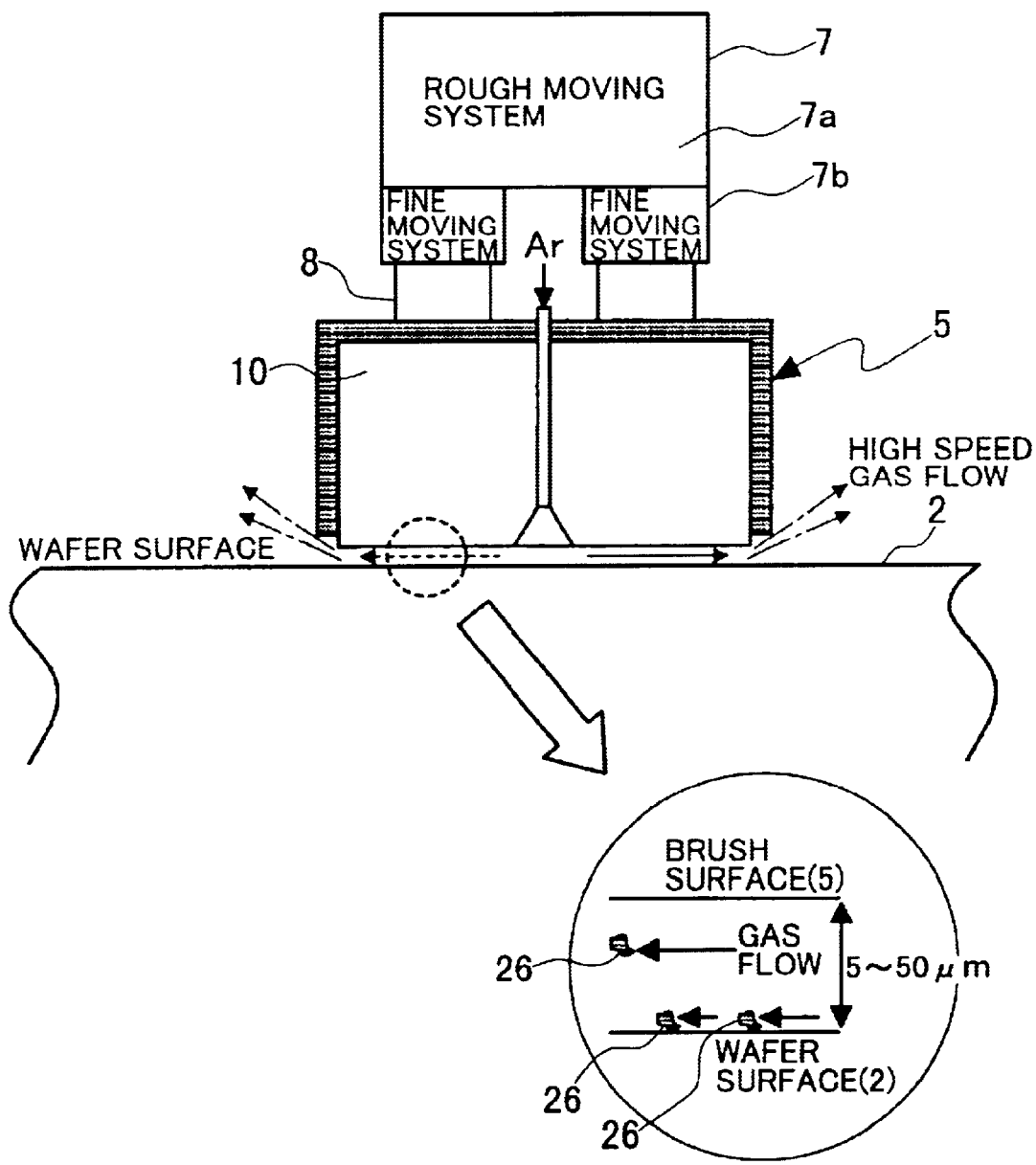
FIG. 13 is an explanatory diagram of an effect of plasma cleaning according to the first embodiment of the invention.

The following discusses the cleaning mechanism with reference to FIG. 13.

First, the function of the pad structure 5 is described. The pad structure 5 mainly serves to apply the physical force to a foreign matter stuck on the surface of the wafer 2 to thereby remove the foreign matter. If the pad structure 5 directly contacts the surface of the wafer 2, however, the acting physical force becomes too strong, damaging the wafer surface. According to the embodiment, therefore, the Ar gas is fed between the pad structure 5 and the wafer surface so that the physical force indirectly acts on the surface of the wafer 2 via the gas. The production of the gas stream between the pad structure 5 and the wafer 2 can cause the frictional stress of the gas stream to act on the wafer surface, so that a large material-moving force can be produced while keeping the non-contact state. That is, one of ideas of the invention is to eliminate a foreign matter 26 stuck on the wafer surface by using the frictional stress of the gas stream.

The wafer elevation means 7 comprises a rough moving system 7a and a fine moving system 7b. The weight detecting means 8 is provided between the fine moving system 7b and the pad 10. The weight detecting means 8 controls the rough moving system 7a and the fine moving system 7b to provide a fine clearance between the pad structure 5 and the wafer 2.

According to the embodiment, as the gas is supplied to the fine clearance between the pad structure 5 and the wafer 2 (specifically, 5 $\mu$m to 50 $\mu$m), a fast gas stream that demonstrates cleaning power over a wide range can be produced. Further, as the cleaning power based on the gas flow speed is determined by the gas flow rate, the cleaning power can be controlled accurately by merely controlling the force acting between the pad structure 5 and the wafer 2 and the flow rate of the gas to be fed. This fine control of the cleaning power can ensure both a low damaging rate and high cleaning power. The fast gas stream can demonstrate cleaning power over everywhere in the fine pattern formed on the surface of the wafer 2 and provides highly efficient physical pattern on which the cleaning performance in wet cleaning does not take effect due to the surface tension.

Second Embodiment

Figure 4:
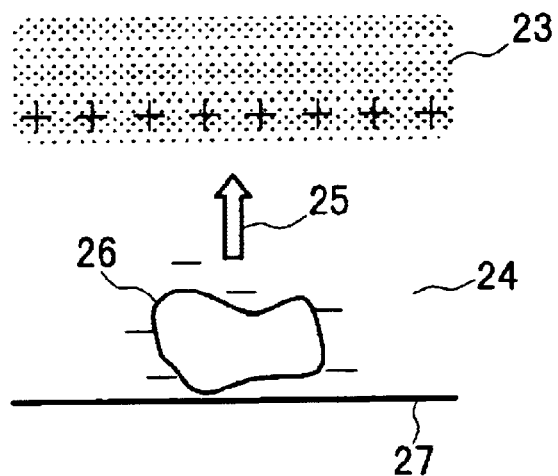
FIG. 4 is an explanatory diagram of an effect of plasma cleaning according to a second embodiment of the invention.
Figure 5:
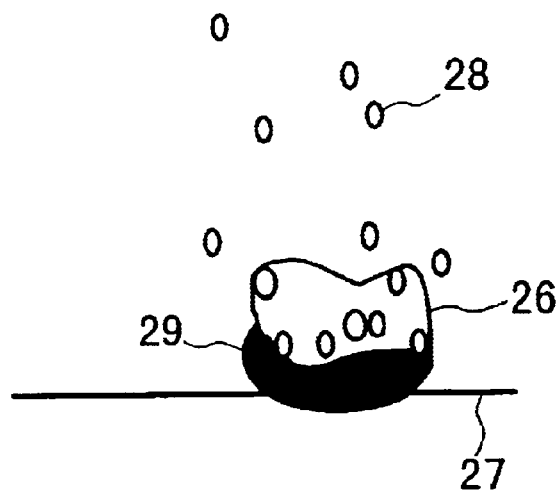
FIG. 5 is an explanatory diagram of the effect of plasma cleaning according to the second embodiment of the invention.
Figure 6:
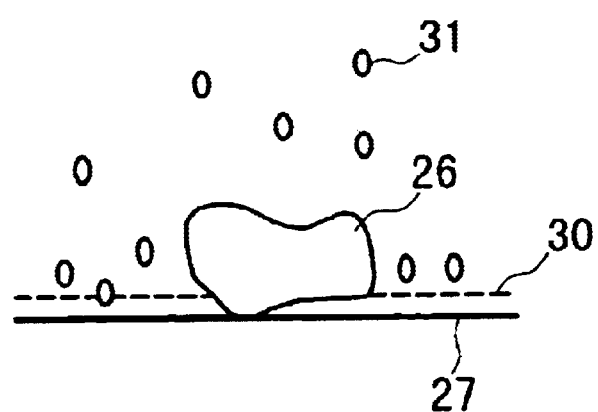
FIG. 6 is an explanatory diagram of the effect of plasma cleaning according to the second embodiment of the invention.

The following describes the principle of the function of the plasma generation means 9 to assist the removal of a foreign matter by the gas stream with reference to FIGS. 4, 5 and 6.

In some case, a foreign matter which is difficult to remove by the physical action of the pad structure 5 alone may be stuck on the surface of the wafer 2. The plasma serves to relax the adsorption force of the foreign matter and enhance the cleaning efficiency. That is, the embodiment removes the foreign matter efficiently by using both relaxation of the adsorption force of the foreign matter, which will be discussed below, and the aforementioned physical action.

First, FIG. 4 shows the mechanism of the plasma to relax the adsorption force of the electrostatically adsorbed foreign matter.

Charge-oriented static electricity adsorption force of a foreign matter 26 occurs on the wafer surface after the semiconductor manufacturing process that uses a plasma, such as plasma etching or sputtering. The foreign matter 26 that is floating in the plasma during the plasma process has negative charges due to the priority charging of electrons in the plasma. As the charge state continues after the plasma process, the foreign matter 26 reaches the wafer surface after the plasma process and is stuck thereon. This makes the foreign matter 26 difficult to remove.

According to the embodiment, therefore, the wafer on which the foreign matter 26 is electrostatically adsorbed is exposed again to a low density plasma 23 generated by the plasma generation means 9. The exposure of the wafer to the low density plasma 23 forms an ion sheath 24 between the plasma and a wafer surface 27. The ion sheath 24 has a high potential on the low density plasma side with respect to the wafer surface side. That is an electric field is produced between the plasma and the wafer surface 27.

For example, the strength of the electric field is 500 to 600 V/cm². Because the potential difference of the ion sheath 24 is opposite to the static electricity adsorption force between the charged foreign matter 26 and the wafer surface 27, the potential difference relaxes the adsorption force, facilitating the removal of the foreign matter 26 stuck on the wafer 27.

The foreign matter whose adsorption force has been relaxed by this mechanism can be removed by the physical action of the pad structure 5. The mechanism of the plasma to relax the static electricity adsorption force that has been discussed with reference to FIG. 4 is merely an illustrate example. The relaxation of the static electricity adsorption force can be accomplished by other mechanisms using various actions, including those mechanisms which have not been discussed.

FIG. 5 is an explanatory diagram of the relaxation mechanism of adsorption force when a foreign matter is chemically adsorbed on the wafer surface.

Generally, when a foreign matter 26 is chemically adsorbed on a wafer 27, a chemical adsorption layer 29 is formed on the contact surface of the foreign matter 26 and the wafer 27, causing an oxidation reaction. From the view point of chemical reaction, this state means that adsorption force is generated by the exchange of electrons between the foreign matter 26 and the wafer surface via the chemical adsorption layer 29. Therefore, an oxygen gas is supplied to generate a plasma, which produces an active species of a strong acidic property, such as ozone or oxygen radicals 28. The active species is stuck on the foreign matter, so that electron exchange on the wafer surface is changed and takes place between the foreign matter 26 and the active species, such as ozone or oxygen radicals 28, thereby relaxing the chemical adsorption force. Of course, a similar effect is obtainable by mixing an oxide reduction gas, such as nitrogen, hydrogen or oxygen.

A lift-off function shown in FIG. 6 is described below.

According to the embodiment, a $CF_4$ gas is supplied to the plasma generation means 9 in addition to the Ar gas supplied from the pad structure 5. The $CF_4$ gas is decomposed into highly reactive halogen radicals 31, such as F or $CF_3$, by the generation of the plasma. The halogen radicals 31 slightly etch (lift off) silicon or silicon oxide in uncleaned wafer surface 30, thus facilitating the removal of the foreign matter 26 that has melted or cut in the wafer surface and enhancing the cleaning power by the physical action of the pad structure 5.

Although the embodiment uses the $CF_4$ gas of a dissociation type, a similar lift-off effect is acquired by using $C_2F_6$, $C_3F_8$, $Cl_2$, $F_2$, HF, $NF_3$, ammonia or hydrogen gas is used.

As a foreign matter is stuck on a wafer in various forms, it is needless to say that the actions that have been discussed with reference to FIGS. 4 to 6 can be combined to remove the foreign matter.

The physical action of the pad structure and the chemical action and electric action by a plasma can achieve highly efficient cleaning of a wafer in a depressurized environment.

Particularly, as the dry cleaning scheme of the invention is used in the production of a semiconductor device having a through hole structure of 0.3 $\mu$m or smaller, the cleaning effect can be demonstrated on the fine pattern portions. This can ensure the production of a high-yield semiconductor device at a low cost.

Although physical action of the pad structure 5 is assisted by the reactive property of a plasma in the embodiment, a similar chemical action is also obtained by using an ultraviolet light source instead of the plasma generation means 9 and exciting a reaction gas supplied into the vacuum chamber, as another embodiment, and can assist the physical action of the pad structure 5.

As a different embodiment, hydrofluoric acid vapor or a gas mixture of hydrofluoric acid and water vapor may be used, instead of a plasma, to ensure the function of lifting off silicon or silicon oxide in the above-described embodiment. This assists the physical action of the pad structure 5.

The assisting scheme in the removal of a foreign matter as in the embodiment can be adapted to the removal of a foreign matter by other means than the combination with the removal of a foreign matter by the gas stream. For example, the assisting scheme may be combined with fast pumping in the vacuum chamber (effective pumping speed of 800 litters/sec or higher).

Further, a main process (etching of an oxide film) and cleaning may be executed consecutively in the vacuum chamber 1 (process chamber) of the semiconductor manufacturing apparatus shown in FIG. 1. Etching takes place on the major surface of a wafer where the pad structure 5 is not covered, and cleaning takes place on the major surface of a wafer where the pad structure 5 is covered.

This method can efficiently clean a reaction product which has been produced at the timing of etching and becomes a foreign matter.

Third Embodiment

The third embodiment is discussed below referring to FIG. 7.

Figure 7:
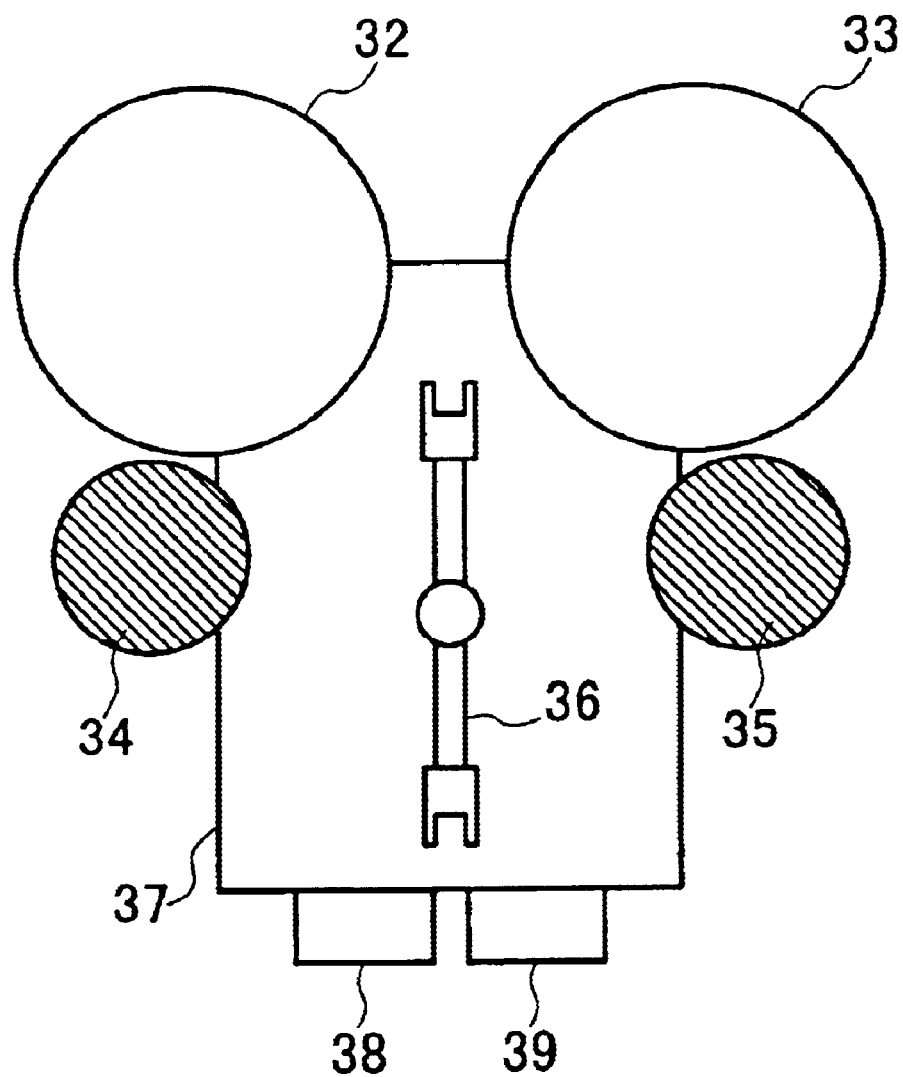
FIG. 7 is a schematic diagram of a semiconductor manufacturing apparatus according to a third embodiment of the invention.

FIG. 7 is a structural diagram of a semiconductor manufacturing apparatus that is a dry etching, plasma CVD or sputtering apparatus to which the cleaning function of the invention is added.

The semiconductor manufacturing apparatus shown in FIG. 7 has a cleaning chamber in addition to a main process chamber (etching chamber) and executes the main process and cleaning process in vacuum in the vacuum chamber 1. Specifically, the semiconductor manufacturing apparatus shown in FIG. 7 comprises main process chambers 32 and 33, cleaning chambers 34 and 35, a wafer transfer chamber 37, a wafer transfer arm 36, a wafer inlet cassette 38 and a wafer outlet cassette 39. The cleaning chambers 34 and 35 are respectively provided in association with the main process chambers 32 and 33. This eliminates the wait time for cleaning and improves the throughput. Each of the cleaning chambers 34 and 35 is constructed by a cleaning apparatus having the pad structure shown in FIG. 1. In those cleaning chambers 34 and 35, a wafer is processed in a single wafer processing fashion.

The manufacturing process for a semiconductor device according to the embodiment is discussed below referring to FIG. 7. For example, the manufacturing process of the embodiment executes an insulating film etching step following a photolithography step. The photolithography step employs the well-known photolithography technique that involves a step of coating of a photoresist film, an exposure step, a developing step and a drying step.

A wafer (not shown) retained in the wafer inlet cassette 38 has already undergone the photolithography step. That is, the wafer has an insulating film (oxide film) formed on the surface of the semiconductor substrate and a photoresist (mask) is patterned on the surface of the insulating film.

Before the main process, wafer cleaning called precleaning is performed. Specifically, a wafer to be processed is transferred from the wafer inlet cassette 38 to the cleaning chamber 34 by the wafer transfer arm 36. The wafer undergoes dry cleaning in the cleaning chamber 34.

Subsequently, the cleaned wafer is moved out of the cleaning chamber 34 and transferred to the main process chamber (etching chamber) 32 by the wafer transfer arm 36. Then, the wafer is subjected to an etching process in the etching chamber 32. The etching chamber 32 is constructed by, for example, a plasma processing apparatus disclosed in Japanese Patent Laid-Open No. 321031/1997.

After the etching process, wafer cleaning called postcleaning is performed. Specifically, the wafer that has undergone the etching process is transferred from the etching chamber 32 to the cleaning chamber 34 by the wafer transfer arm 36. The wafer undergoes dry cleaning again in the cleaning chamber 34.

After the postcleaning is finished, the wafer is transferred to the wafer outlet cassette 39 by the wafer transfer arm 36.

As apparent from the above, the wafer undergoes the etching step including cleaning without being exposed to air.

A similar wafer process also takes place in the cleaning chamber 35 and the main process chamber (etching chamber) 33.

Next, the wafer outlet cassette 39 where the wafer that has undergone the etching step is retained is transferred for execution of a next step, e.g., a photoresist removing step (photoresist ashing).

According to the embodiment, after a main process on the wafer is completed in the main process chambers 32 and 33, the wafer is transferred to the cleaning chambers 34 and 35 by the wafer transfer arm 36 in the wafer transfer chamber 37. The wafer is cleaned in the cleaning chambers 34 and 35 by the cleaning scheme of the first embodiment or the cleaning scheme of the second embodiment or the combination of both.

The embodiment can eliminate an extra step involved in wet and reduce the production cost for semiconductor devices.

Because processes are performed in vacuum in the embodiment, the probability of causing surface reforming after the execution of the processes is reduced, and the device characteristics and the yield are improved while increasing the throughput. That is, the TAT in the manufacture of a semiconductor device is shortened.

Fourth Embodiment

The main process chamber 33 shown in FIG. 7 may be replaced with an asher as a photoresist removing step.

In this case, after postcleaning is performed in the cleaning chamber 34, a wafer is transferred to the main process chamber 33 by the wafer transfer arm 36 and photoresist removing step is carried out by a plasma process in the main process chamber 33. After the photoresist removing step ends, the wafer is transferred to the cleaning chamber 35 to undergo dry cleaning.

Unlike the third embodiment that performs a single process, the fourth embodiment executes a plurality of processes in vacuum or executes the etching step, the photoresist removing step and cleaning steps that take place before or after the former two steps, without exposing the wafer to air.

According to the embodiment, the ashing process is performed after the etching process after which the cleaning process of the invention is executed in vacuum. This eliminates the need for a wet cleaning step and can prevent surface reforming and remove a foreign matter at a fine pattern potions, thereby improving the precision in the subsequent steps and the yield.

Further, the TAT from the etching step to the photoresist removing step is shortened.

Fifth Embodiment

Figure 8:
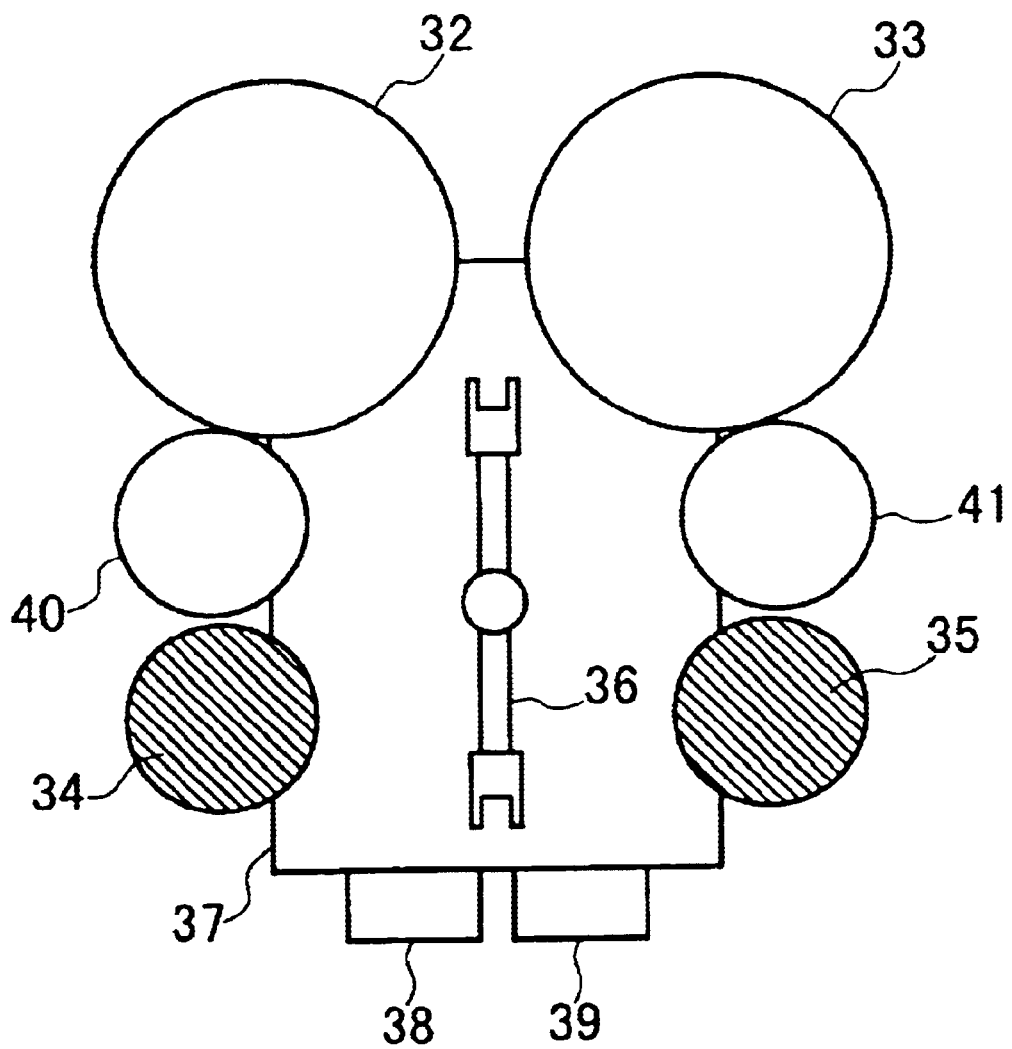
FIG. 8 is a schematic diagram of a semiconductor manufacturing apparatus according to a fifth embodiment of the invention.

A semiconductor manufacturing apparatus shown in FIG. 8 is an application example of the embodiment shown in FIG. 7.

In addition to the main process chambers 32 and 33, the semiconductor manufacturing apparatus of the embodiment comprises postprocess chambers 40 and 41 (ashers) provided in association with the main process chambers 32 and 33. An etching step or a main process is performed in the main process chambers 32 and 33, and an ashing step to remove a resist mask is performed in the postprocess chambers 40 and 41. Specifically, the embodiment processes a wafer in the following manner.

A wafer (not shown) retained in the wafer inlet cassette 38 has already undergone the photolithography step. That is, the wafer has an insulating film (oxide film) formed on the surface of the semiconductor substrate and a photoresist (mask) is patterned on the surface of the insulating film.

Before the main process, a wafer to be processed is transferred from the wafer inlet cassette 38 to the cleaning chamber 34 by the wafer transfer arm 36. The wafer undergoes dry cleaning in the cleaning chamber 34.

Subsequently, the cleaned wafer is moved out of the cleaning chamber 34 and transferred to the main process chamber (etching chamber) 32 by the wafer transfer arm 36.

Then, the wafer is subjected to an etching process in the etching chamber 32. The etching chamber 32 is constructed by, for example, the plasma processing apparatus disclosed in Japanese Patent Laid-Open No. 321031/1997 as per the third embodiment.

After the etching process, the wafer that has undergone the etching process is transferred from the etching chamber 32 to the postprocess chamber (asher) 40 by the wafer transfer arm 36. The wafer undergoes a photoresist removing step by a plasma process in the postprocess chamber (asher) 40.

After the photoresist removing step is finished, the wafer is transferred to the cleaning chamber 34 to undergo dry cleaning.

After cleaning is finished, the wafer is transferred to the wafer outlet cassette 39 by the wafer transfer arm 36.

As apparent from the above, the wafer undergoes the etching step and the photoresist removing step including cleaning steps without being exposed to air.

Similar wafer processes are executed in parallel in the cleaning chamber 35, the main process chamber (etching chamber) 33 and the postprocess chamber (asher) 41.

The embodiment has advantages similar to those of the fourth embodiment. As the main process chambers (etching chambers), the postprocess chambers (ashers) and the cleaning chambers are arranged in a horizontally symmetrical fashion and wafer processes are executed in parallel, the wafer processing performance is improved.

Sixth Embodiment

The following discusses another embodiment which executes a plurality of processes in vacuum in manufacturing a semiconductor device, with reference to FIG. 9 and FIGS. 10A to 10E.

Figure 9:
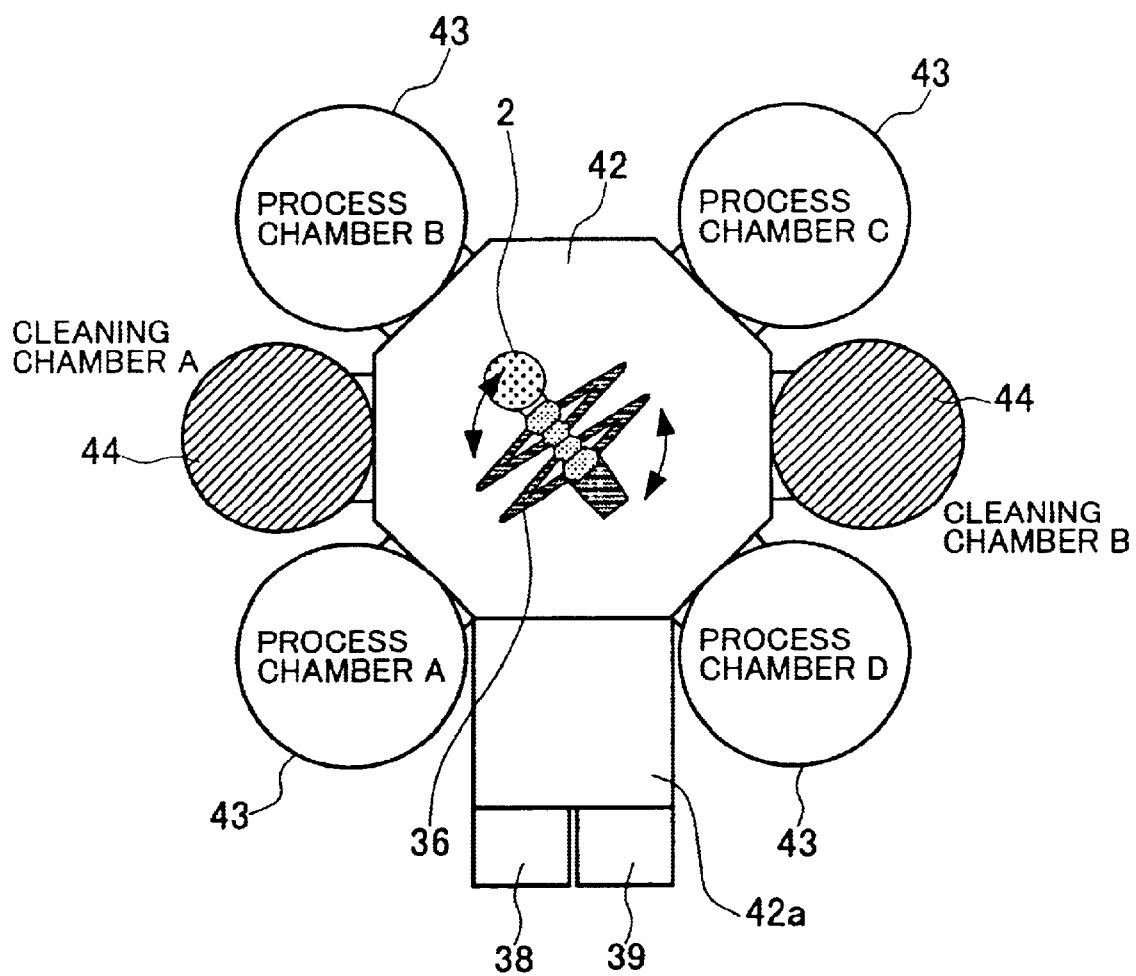
FIG. 9 is a schematic diagram of a semiconductor manufacturing apparatus according to a sixth embodiment of the invention.

A semiconductor manufacturing apparatus shown in FIG. 9 has a plurality of process chambers 43 connected together via a multichamber transfer chamber 42. At least one cleaning chamber 44 which has the structure shown in FIG. 1 is connected to the multichamber transfer chamber 42. The embodiment shown in FIG. 9 is a module which has four process chambers and two cleaning chambers connected to the multichamber transfer chamber 42.

The embodiment can achieve highly efficient cleaning in vacuum and increases the number of steps that can be carried out in vacuum. The larger the number of steps that can be performed in vacuum becomes, the lower the production cost for semiconductor devices becomes and the higher the throughput gets. In addition, the work precision is improved. It is therefore possible to manufacture high-performance semiconductor devices at a low cost.

The manufacturing process for a semiconductor device that is fabricated by the module shown in FIG. 9 is discussed below referring to FIGS. 10A through 10E.

FIGS. 10A to 10E are step-by-step cross-sectional views showing the process of forming through holes of 0.3 μm or less in diameter and an aspect ratio (film thickness/hole diameter) of 50 or above in an oxide film. An oxide film 100 is an interlayer insulating film formed between, for example, an upper interconnection pattern and a lower interconnection pattern.

Figure 10A:
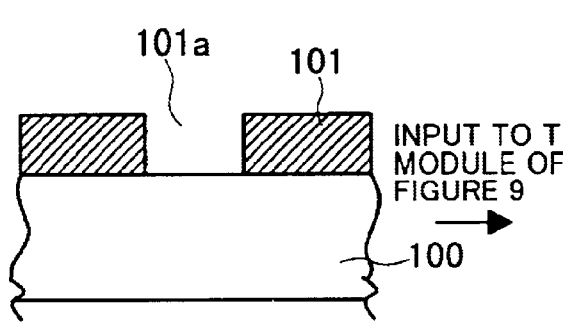
FIGS. 10A through 10E are cross-sectional views respectively showing steps of manufacturing a semiconductor device through vacuum using the apparatus in FIG. 9.

FIG. 10A: A semiconductor substrate (wafer) is prepared which has a polysilicon (polycrystalline silicon) mask 101 patterned on the oxide film 100. The polysilicon mask 101 has an opening 101a for forming a through hole patterned by the ordinary photolithography technique. The wafer 2 is retained in the wafer inlet cassette 38 shown in FIG. 9.

Figure 10B:
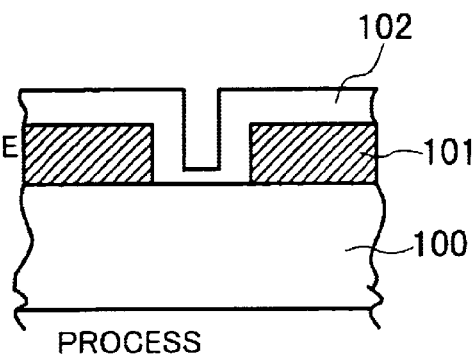

FIG. 10B: Then, the wafer 2 is transferred to the multichamber transfer chamber 42 via a spare chamber 42a. Then, the wafer 2 is transferred into a process chamber A by the wafer transfer arm 36. In the process chamber A, polysilicon 102 is deposited on the patterned polysilicon 101 by CVD.

Figure 10C:
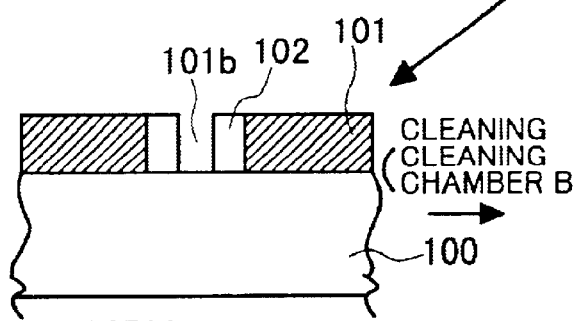

FIG. 10C: After the CVD, the wafer 2 is cleaned in a cleaning chamber A. Then, the wafer 2 is transferred to a process chamber B where the polysilicon 102 is left on the side wall of the opening 101a of the mask 101 by dry etching (anisotropic etching) of the polysilicon 102. This scheme can form an opening 101b smaller in diameter than the opening 101a in the opening 101a in a self-aligned manner.

Figure 10D:
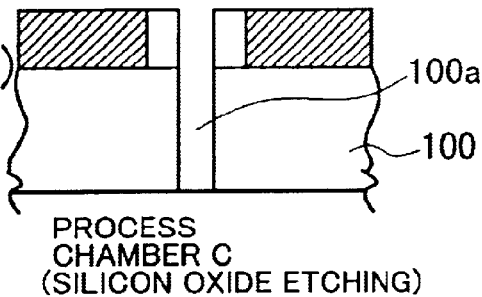

FIG. 10D: Subsequently, the wafer 2 is cleaned in a cleaning chamber B. Then, the oxide film 100 is subjected to dry etching in a process chamber C to form a through hole 100a in the oxide film 100. The process chamber C is constructed by, for example, the plasma processing apparatus disclosed in Japanese Patent Laid-Open No. 321031/1997.

Figure 10E:
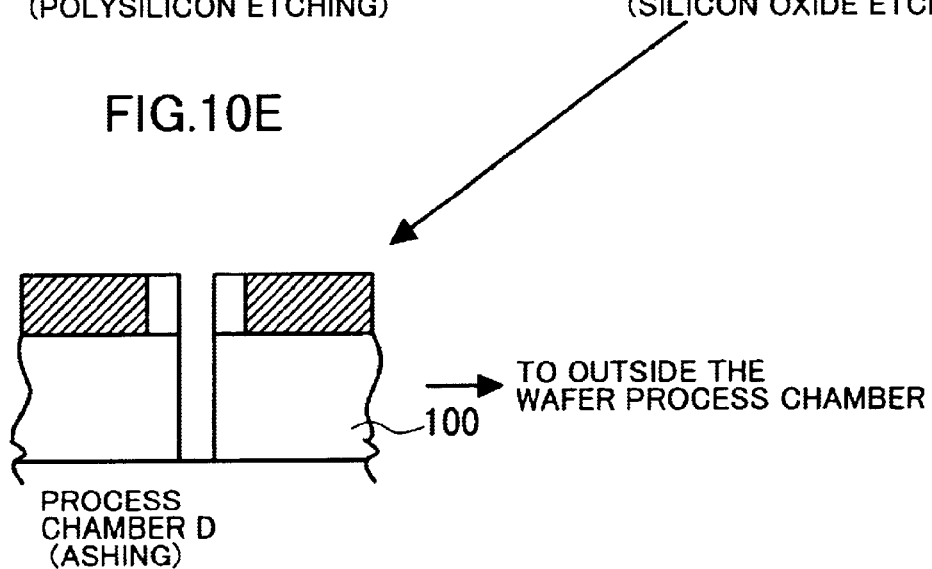

FIG. 10E: After the oxide film 100 is etched, an organic film that has been deposited during the etching of the oxide film 100 is removed by ashing in a process chamber D.

The sequence of processes can process the oxide film in a smaller size than the size at which the polysilicon mask was initially patterned. This can allow film processing in a size smaller than the minimum size that is allowed by the state-of-the-art photolithography technology.

As the embodiment is realized by the module of the invention shown in FIG. 9, cleaning which is generally executed in between processes can be accomplished at a significantly low cost as compared with the case where wet cleaning is performed.

Because the embodiment executes the sequence of the CVD step, the polysilicon etching step, the silicon oxide etching step and the ashing step in vacuum, the embodiment eliminates a factor of lowering the yield, such as the formation of a natural oxide film by exposure to air. Further, the embodiment improves the processing precision of a through hole.

Seventh Embodiment

An embodiment in which cleaning of the invention is adapted to a process of fabricating an MISFET that is the basic portion of a semiconductor device is described below with reference to FIGS. 11A to 11F.

Figure 11A:
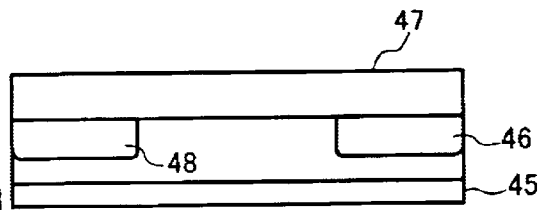
FIGS. 11A through 11F are cross-sectional views respectively showing steps of manufacturing a semiconductor device according to a seventh embodiment of the invention.
Figure 11B:
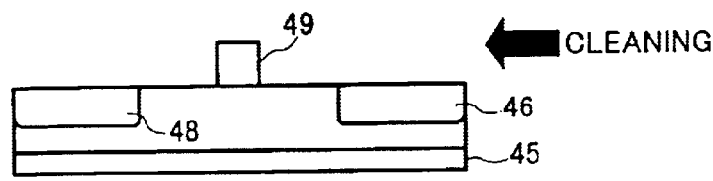
Figure 11C:
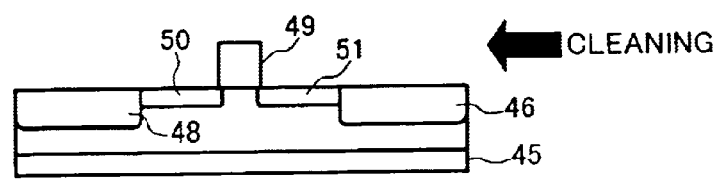
Figure 11D:
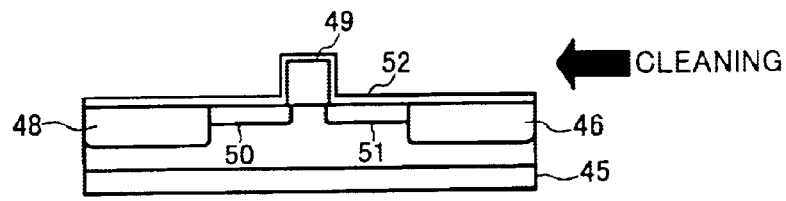
Figure 11E:
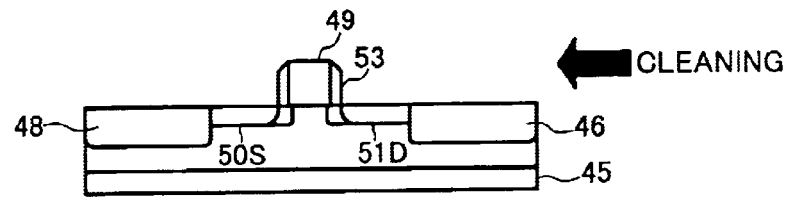
Figure 11F:
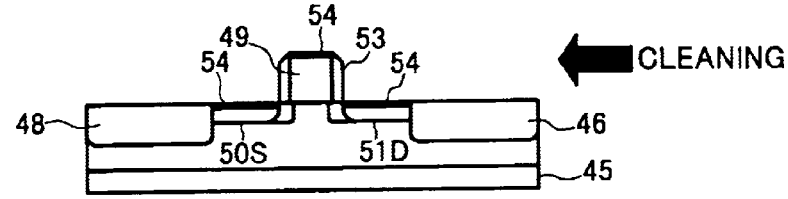

The formation of an MISFET is carried out in the order of a step in FIG. 11A for fabrication of a device isolation region and deposition of polysilicon for a gate, a step in FIG. 11B for fabrication of a gate electrode (polysilicon etching), a step in FIG. 11C for fabrication of extensions (N regions) by ion implanting, a step in FIG. 11D for deposition of a nitride film 52, a step in FIG. 11E for fabrication of a gate side wall protection film (etching of the nitride film), and a step in FIG. 11F for fabrication of a silicide film. The cleaning that has been discussed in the foregoing description of the first embodiment is executed between the steps of FIGS. 11A to 11F.

The steps of FIGS. 11A to 11F are briefly described below.

Step in FIG. 11A: A device isolation region 46 is formed in a silicon substrate 45 for device isolation. The silicon substrate 45 is a P-type substrate which has a P well formed therein. Subsequently, gate polysilicon 47 is deposited via a gate oxide film (not shown). The gate polysilicon 47 is formed by CVD in a vacuum chamber.

Step in FIG. 11B: Dry etching of polysilicon is executed in the vacuum chamber, thereby forming a gate electrode 49.

Step in FIG. 11C: Extensions (N regions 50 and 51) aligned with the gate electrode 49 is formed by ion implanting. The extensions are source and drain regions with a relatively low concentration that are formed to cope with hot electrons.

Step in FIG. 11D: A nitride film 52 is deposited by plasma CVD on the semiconductor substrate 45 having the gate electrode 49.

Step in FIG. 11E: The nitride film 52 is subjected to dry etching (anisotropic etching), thereby forming a gate side wall protection film 53 on the side walls of the gate electrode 49. Then, the dry cleaning that has been discussed in the foregoing description of the first embodiment is executed. Then, contact N⁻ regions (source and drain regions 50S and 51D) with a relatively high concentration that are aligned with the gate side wall protection film 53 are formed by ion implanting.

Step in FIG. 11F: Next, a silicide film 54 is formed on the surfaces of the source and regions 50S and 51D and the surface of the gate electrode 49 to reduce the resistance. For example, the silicide film 54 is formed by adhering cobalt to the surfaces of the source and regions 50S and 51D and the surface of the gate electrode 49 and then subjecting the structure to a heat treatment.

As the embodiment performs dry cleaning between the individual steps in the MISFET fabrication process, it is possible to manufacture high-performance semiconductor devices with a high production yield and at a low cost.

Figure 12A:
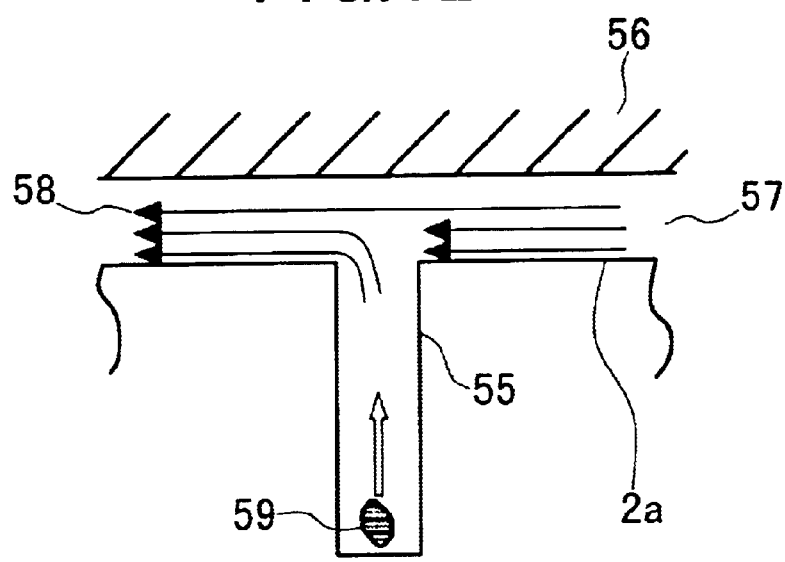
FIG. 12A is a conceptual diagram illustrating an effect of cleaning at fine holes used in the seventh embodiment of the invention.
Figure 12B:
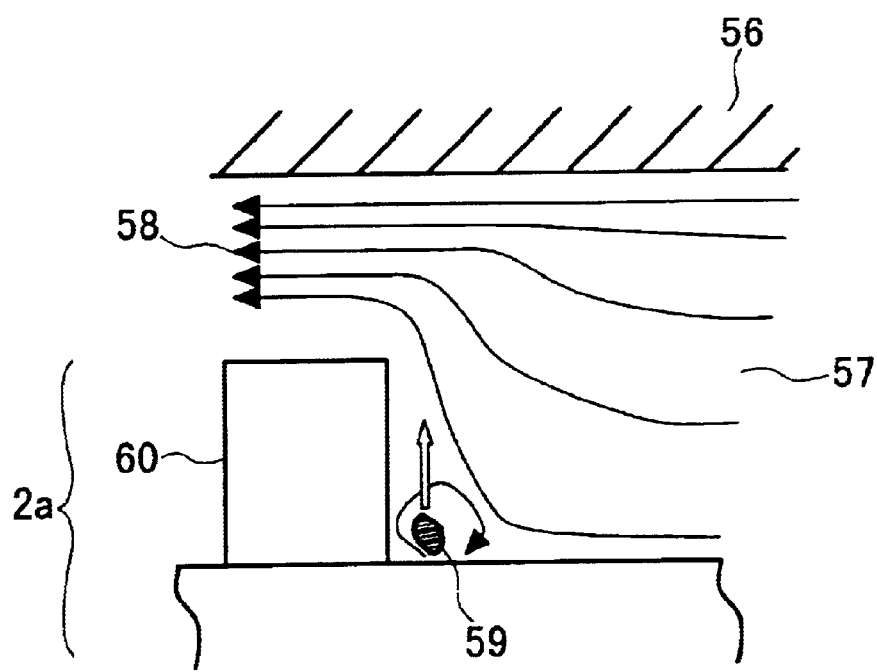
FIG. 12B is a conceptual diagram illustrating an effect of cleaning at a step portion in a fine pattern used in the seventh embodiment of the invention.

The foregoing description of the manufacturing process of a semiconductor device according to the embodiment has been given of an example of a single MISFET shown in FIGS. 11A to 11F. Actually, a plurality of such MISFETs are formed on a single semiconductor substrate to construct a semiconductor integrated circuit device, such as LSI or VLSI. Therefore, very fine patterns of 0.3 μm or less shown in FIGS. 12A and 12B are located here and there on the wafer surface. The following discusses the effect of cleaning a wafer surface having such very fine patterns.

FIG. 12A is an explanatory diagram for a function of removing a foreign matter 59 stuck inside a deep contact hole 55, and FIG. 12B is an explanatory diagram for a function of removing the foreign matter 59 stuck on a corner portion of a wiring 60 (step portion of the wiring).

Because a physical action for removing the foreign matter 59 is produced in a clearance 57 between a pad structure 56 and a wafer surface 2a by the viscos friction that is caused a gas stream 58 as shown in FIGS. 12A and 12B, the cleaning effect can be demonstrated over a range where the gas stream reaches.

As a liquid is hard to penetrate a fine pattern due to the surface tension, there may be a case where the conventional wet cleaning may not provide a sufficient cleaning effect for a pattern of 0.3 μm or less. As the invention uses a gas stream having no surface tension, however, the invention can demonstrate a good cleaning effect for semiconductor devices whose patterns are expected to become finer and fine in the future.

The manufacturing method of the invention is effective in manufacturing a system LSI which demands a shorter TAT, e.g., an LSI which has a memory LSI and a logic LSI mounted on a single chip, and can perform cleaning efficiently to thereby manufacture low-cost, high-yield system LSI in a short period of time.

Although the invention made by the present inventors has been described specifically with reference to preferred embodiments, the invention is not limited to the embodiments but may be modified in various forms without departing the scope of the invention.

The following is a brief description of the effect that is obtained by a typified one of the subject matters disclosed in this application.

According to the invention, cleaning between steps that are performed in a depressurized chamber can be executed without being exposed to air, so that the reliability and the production yield of semiconductor devices having fine patterns can be improved.

What is claimed is:

1. A method for dry cleaning a semiconductor device, comprising:
   (1) a step of forming a first film on a major surface of a substrate in a pattern;
   (2) a step of placing said substrate having said patterned first film in a process chamber; and
   (3) a step of placing above said major surface of said substrate, a pad structure having major surface opposing to said major surface of said substrate and having a gas ejection section provided on said major surface of the pad structure, and ejecting a cleaning gas from a gas ejection section in a depressurized state in said process chamber;
   (4) a step of controlling distance between said major surface of said substrate and said major surface of the pad structure thereby gearing a gas pressure therebetween to a desired gas pressure; and
   (5) a step of moving said major surface of the pad structure relatively in parallel with said major surface of said substrate.

2. The method according to claim 1, wherein said substrate is a semiconductor wafer.

3. The method according to claim 1, wherein a plurality of gas ejection sections provided on said major surface of said pad structure are placed apart from one another at an identical distance, and said cleaning gas is ejected toward said major surface of said substrate from said plurality of gas ejection sections in said steps (3), (4) and (5).

4. The method according to claim 3, wherein said plurality of gas ejection sections include a single gas ejection section located in a center of said major surface of said pad structure and other gas ejection sections arranged at a peripheral portion of said major surface of said pad structure.

5. The method according to claim 1, wherein said cleaning gas consists of one of Ar, nitrogen, He and Ne.

6. The method according to claim 2, wherein a diameter of said major surface of said pad structure is smaller than a diameter of said major surface of said substrate.

7. A method for manufacturing a semiconductor device, comprising:
   (1) a step of forming an insulating film on a major surface of a semiconductor substrate;
   (2) a step of forming at least one through hole in said insulating film by dry etching;
   (3) a step of placing said semiconductor substrate having said hole-formed insulating film in a process chamber; and (4) a step of keeping inside said process chamber in a depressurized state, placing, above said major surface of said substrate, a pad structure having a major surface opposing to said major surface of said substrate, and having a gas ejection section provided on said major surface of said pad structure, and ejecting a cleaning gas from said gas ejection section (5) a step of controlling a distance between said major surface of said substrate and said major surface of the pad structure by detecting a force acting therebetween to a desired gas pressure; and (6) a step of cleaning said hole-formed insulating film on said major surface of said semiconductor substrate by moving said major surface of the pad structure relatively in parallel with said major surface of said substrate.

8. A method for manufacturing a semiconductor device, comprising:

a step of forming a film having a pattern on a major surface of a semiconductor substrate;

a step of placing said semiconductor substrate in a process chamber;

a step of maintaining inside of said process chamber in a depressurized sate, and supplying an etching gas into said process chamber to thereby form a plasma environment; and a step of placing, above said major surface of said substrate, a pad structure having a major surface opposing to said major surface of said substrate and having a gas ejection section provided on said major surface of said pad structure, and ejecting a cleaning gas from said gas ejection section;

a step of controlling a distance between said major surface of said substrate and said major surface of the pad structure thereby gearing a gas pressure therebetween to a desired gas pressure, and a step of moving said major surface of the pad structure relatively in parallel with said major surface of said substrate.

9. The method according to claim 8, wherein said cleaning gas consists of one of Ar, nitrogen, He and Ne.

10. A method for manufacturing a semiconductor device, comprising:

(1) a step of loading a semiconductor wafer into a process chamber;

(2) a step of performing a plasma process on a major surface of said semiconductor wafer and performing a cleaning process on said major surface with a gas stream; and (3) a step of unloading said semiconductor wafer from said process chamber.

11. The method according to claim 1, wherein said step (5) involves generating plasma of an etching gas in said process chamber.

12. The method according to claim 1, wherein said substrate is rotated and said pad structure is moved in parallel with said major surface of said substrate in said step (5).

13. The method according to claim 7, wherein said step involves generating plasma of an etching gas in said process chamber.

14. The method according to claim 10, wherein one of $CF_4$, $C_2F_6$, $C_3F_x$, $Cl_2$, $F_2$, Hf, ammonia, and hydrogen is used in the plasma process for plasma generation, and one of Ar, nitrogen, He and Ne is used in the cleaning process as cleaning gas.

* * * * *